Aug. 16, 1966 E. A. GUTBIER 3,266,136

MASS SOLDERING APPARATUS AND METHOD USING VIBRATORY ENERGY

Filed March 29, 1963 2 Sheets-Sheet 1

INVENTOR
E. A. GUTBIER
BY A. J. Nugent
ATTORNEY

Aug. 16, 1966 E. A. GUTBIER 3,266,136

MASS SOLDERING APPARATUS AND METHOD USING VIBRATORY ENERGY

Filed March 29, 1963 2 Sheets-Sheet 2

3,266,136

MASS SOLDERING APPARATUS AND METHOD USING VIBRATORY ENERGY

Ernst A. Gutbier, Atkinson, N.H., assignor to Western Electric Company, Incorporated, New York, N.Y., a corporation of New York Filed Mar. 29, 1963, Ser. No. 268,996
5 Claims. (Cl. 29—471.1)

This invention relates to methods of and apparatus for mass soldering and particularly to apparatus utilizing vibratory energy in the simultaneous soldering of a multiplicity of electrical component leads to printed wiring board circuits.

The evolution of printed wiring board technology has resulted in low cost mass-produced circuits for a variety of applications. Improvements in manufacturing methods and board design have contributed heavily to reducing costs and facilitating the adoption of these circuits in electronic assemblies. On the other hand, the widespread usage of printed boards, particularly in sophisticated electronic devices, has emphasized the need for high quality, reliable circuits.

The manufacturing process for printed wiring boards now includes techniques such as automatic component insertion and mass soldering which eliminate many prior manual operations. In a typical arrangement, a plurality of electrical components, for example, resistors, capacitors, diodes, transistors, etc., are mechanically mounted on printed wiring boards with their leads extending through apertures therein. The leads are bent or crimped into contact with predetermined portions of the wiring circuit called land areas, on a face of the board. The components are then mass soldered to the circuits normally using apparatus and techniques of the type disclosed in Patent 3,037,274 to W. M. Hancock and Patent 3,100,471 to E. A. Gutbier.

Manifestly, in making reliable solder connections to the aforementioned circuits or, stating the proposition quantitatively, where the requirements are that a connection should fail only about once in every 50,000 connections, almost perfect soldering conditions are dictated. Perhaps, the most serious deterrent to attainment of such high standards has been the presence of oxides or a variety of layer formations on component lead wires. Difficulty also occurs frequently when the component leads have not been tinned or have been improperly tinned. Since many applications can be conceived where almost total reliability is required, tedious manual soldering or 100% inspection with touch-up has been necessary in these cases. In some instances, despite a thorough visual inspection procedure, defects will enter into the final product since the tinning may leave a loose sleeve on the terminal which will create the false impression that a terminal is adequately pretinned.

Despite protective finishes such as solder coating, water dip lacquer or even gold, the solderability of lead wire surfaces which will be joined perhaps months after the finish is applied cannot be guaranteed. The degree of solderability of oxide-laden metal surfaces is usually low and non-corrosive rosin base soldering fluxes are not active enough to properly join such surfaces. Acid or corrosive-type fluxes while performing an adequate cleaning job produce many undesirable effects and consequently are avoided wherever possible. This is particularly true where long-life is required, for example, when a circuit board is placed in the field where repair costs or downtime might be considerable.

A further production handicap results from the relatively low mass soldering temperatures which are permissible in printed wiring board manufacture. The limited heat resistance of the base laminate and adhesive makes it necessary to solder at temperatures slightly above the melting point of solder. Frequently, 10 seconds at about 465° F. is used with a tin-lead eutectic solder. Since the volume of solder concentrated at any particular area on the board is relatively small, the change from a liquid to a solid is practically instantaneous for the aforementioned solder because the heat energy is rapidly dissipated into the surrounding air as the unit is removed from the molten solder. If clean surfaces are not presented to the solder, the likelihood of a good connection is remote.

While the use of ultrasonic energy has been suggested with relation to soldering in the prior art and satisfactory results have been achieved, these processes have usually been confined to still pot soldering. In these devices, an ultrasonic vibrator is immersed in a solder pot to agitate the solder and facilitate the connecting operation. It must be noted, however, that cavitation can only be produced in the pot by using a large costly vibrator unit. Furthermore, the solder pot technique is not readily adaptable to large-scale production.

Accordingly, an object of this invention is to mass solder printed wiring boards with a high degree of reliability.

Another object of this invention is to produce reliable solder connections on printed wiring boards by a process including ultrasonic energy.

A further object of this invention is to provide an economical mass soldering method and apparatus for printed wiring boards using vibrations, especially in a range above the sonic spectrum to assure rugged and reliable solder connections.

In accordance with these and other objects and features of this invention, one embodiment thereof relates to a method comprising the steps of forming a stream of molten solder, immersing a succession of printed wiring boards, with the circuit patterns previously tinned or untinned, into the flowing stream until the wiring circuits and the adjacent lead portions are submerged, and then moving the boards over one or more vibrated stream portions to form soldered assemblies. No flux is required and an excellent soldered connection is made to the terminal portions cleaned by the localized application of ultrasonic energy. Furthermore, ultrasonic mass soldering by vibratory energy tends to refinish land areas or conductor paths on the printed board circuits which otherwise might not be solderable, reducing the number of rejected boards.

A further embodiment of this invention involves a multi-step soldering process wherein a succession of printed wiring boards are carried first into an ultrasonically energized portion of a flowing solder stream for a cleaning and pretinning operation and then moved through a soldering station to form soldered assemblies. The ultrasonic vibrators scrub or clean the lead terminals of coatings which affect solderability and perform what might be called a pretinning function since they facilitate the formation of a solder bond on untinned or poorly tinned leads prior to their arrival at the soldering station portion of the molten stream. A reliable solder connection is assured by presenting at the soldering station a receptive surface upon which a bond has already been formed.

The soldering station not only produces a reliable final connection, but as a further important advantage, it also improves the appearance of the wiring board circuit. The ultrasonic technique tends to produce a rough finish or mar the appearance of previously tinned conductive surfaces or circuit paths and makes it difficult for an operator to determine whether or not any defects remain on final inspection. The final soldering provides a smooth shiny finish improving both the appearance and the quality of the soldered areas.

The apparatus employed to practice the method of this invention includes a continuously flowing solder stream of conventional design with one or more vibrators actuated in an ultrasonic mode from an electrical drive located therein. These ultrasonic vibrators are situated transversely to the movement of the boards through the stream and energize a controlled height of the oxide-free solder. The transmission of vibratory energy into the molten melt at frequencies ranging from between about 60 cycles per second and slightly below to several hundred thousand cycles per second results in cavitation of a relatively small area which effectively scrubs the lead wires for connection purposes. Using ultrasonic energy, a solder bond may even be formed on aluminum which has always been difficult to solder because of oxide formation. While an ultrasonic vibrator is mentioned it will be understood that vibrations above and in the sonic spectrum may be employed.

Other objects and advantages will be apparent when considered in conjunction with the accompanying drawings, wherein.

Figure 1:
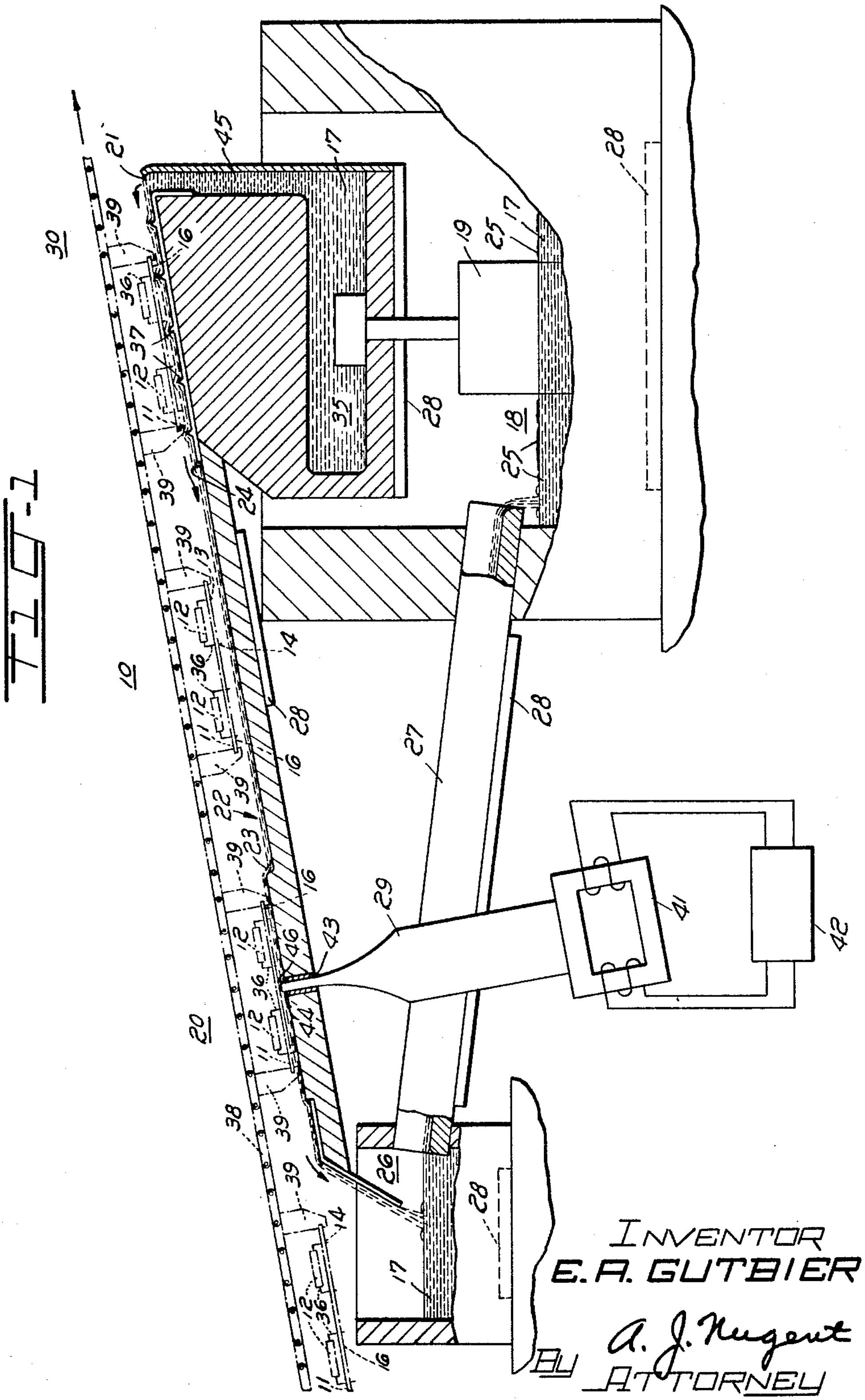
FIG. 1 is a broken away side view of the apparatus for practicing the invention.

Referring to FIG. 1 of the drawings, one illustrative embodiment of this invention comprises a mass soldering apparatus 10 which includes a cleaning and pretinning work station 20 and a subsequent soldering work station 30. The apparatus 10 is designed to produce reliable soldered connections on printed wiring boards 11 having components 12 affixed thereto by means of leads 36 which extend through apertures 13 to contact circuits 14 on the bottom face 16. To achieve the desired results, the circuits 14 on a continuous succession of conveyor-carried boards 11 are first cleaned and pretinned in a flowing solder stream 23 using concentrated ultrasonic energy and then brought back into contact with molten solder 17 at a subsequent work station 30 for a bonding operation. Fluxing could be provided intermediate the two stations, if desirable. While the invention is illustrated in FIG. 1 as a multi-step operation, it may, of course, be possible in some instances to move printed boards 11 through an ultrasonically agitated solder stream to form reliable connections in a single step.

The soldering apparatus 10 typically includes a solder reservoir 18 and pumping means 19 which raises the solder from beneath the surface dross 25 into a cavity 35 up a narrow vertical column 45 and then through an opening 21 onto a shallow inclined trough 22 in a uniform stream 23. This solder stream 23 is usually about ⅛ inch to ¼ inch in depth and is dross-free due to the previously described pumping arrangement. The solder 17 flows down the incline over a washboard-like soldering area 30, then over a predetermined length of depressed channel 24 and finally over an ultrasonically agitated work station 20 into a subsidiary reservoir 26. This reservoir 26 feeds a return chute 27 which guides the solder 17 back to the main reservoir 18. Numerous strategically placed heating elements 28 are utilized to keep the solder 17 in a molten state throughout the system.

Figure 3:
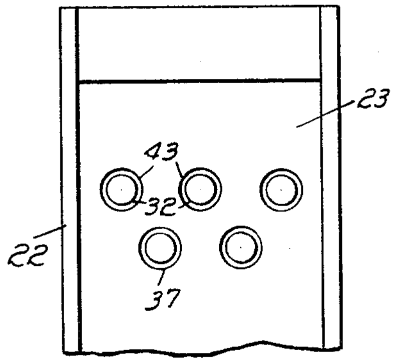
FIG. 3 is a top view of an inclined soldering trough with a plurality of ultrasonic vibrators mounted to the base portion thereof.

The cleaning and pretinning work station 20, as seen in FIG. 1, comprises one or more ultrasonic energy sources 29, suitably mounted to the inclined trough 22 containing the molten solder stream 23 by means of a resilient seal 43 and extending into said stream a predetermined distance 44. While FIG. 1 illustrates a single substantially wedge-shaped tool 29, a plurality of smaller wedge-shaped tools might be used to achieve the same effect. Typical vibrators 29 could, for example, be high energy magnetostrictive transducers with expanding and contracting nickel elements driven by an electrical oscillating unit 42. Piezoelectric vibrators may also be used. Of course, it is entirely conceivable that in some instances, as illustrated in FIG. 3, it may be preferable to have a plurality of individual vibrators (not shown) connected to and actuating individual diaphragms 32. These ultrasonic energy sources would be located transversely to the conveyorized movement of printed boards 11 through the stream 23 and would be preferably arranged in a staggered array adjacent to the introductory feed portion of the stream 23. Such an arrangement would be advantageous since it permits violent stream agitation with a maximum degree of control.

Figure 4:
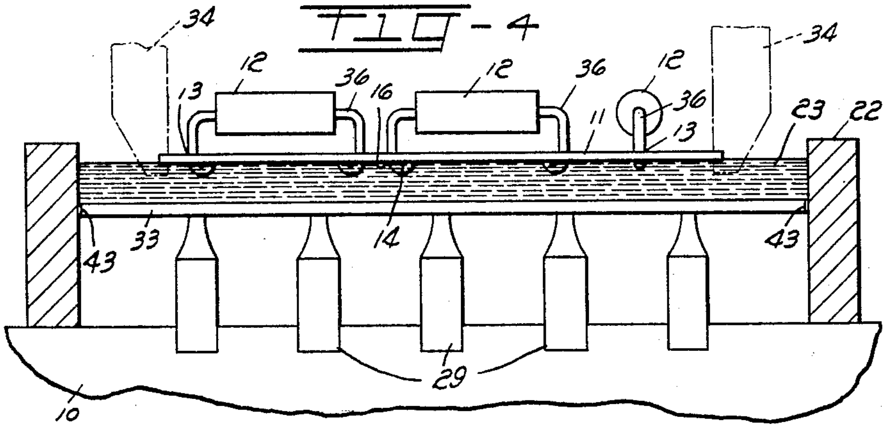
FIG. 4 is a front view illustrating a diaphragm actuated by a plurality of ultrasonic vibrators.

A further, though not by any means inclusive, embodiment comprises a single diaphragm 33 actuated by a plurality of ultrasonic vibrators 29. A suitable flexible seal 43 is selected to permit movement of the diaphragm 33. This embodiment which is illustrated in FIG. 4, permits the use of smaller, individually adjustable vibrators 29. A typical printed board is shown with the base circuit 14 and component leads 36 immersed in a solder stream 23 which is presently in a quiescent state.

The ultrasonically induced stream cavitation at the initial work station 20 of FIG. 1 insures clean solderable surfaces on component leads 36 which extend through and contact circuits 14 on the base 16 of the board 11. A controlled height 46 of solder 17 may be violently agitated by adjustment of the ultrasonic input to scrub the lead wires 36 of oxide or detrimental intermetallic layer formations. The ultrasonically energized stream portion 20 also serves as a pretinning station where an initial solder bond is formed on leads 36 which fail to meet tinning requirements. The bonding is enhanced by the stream agitation which floats away surface contaminants precluding formation of voids or inclusions in the tinned surfaces.

The soldering work station 30 is located at the upper end of the inclined trough 22 and includes a plurality of transverse projections 37 which direct the flowing solder against the base circuits 14 of the printed boards 11. One such arrangement is shown in greater detail in Patent 3,039,185 to William L. Oates.

In operation, printed wiring boards 11 with components 12 affixed thereto and extending through apertures 13 to contact the circuits 14 on the bottom face 16 are fed successively onto a conveyor belt 38 which moves upstream against the flowing solder. As the conveyor-carried board 11, held by suitable connections 34, enters the stream, one or more ultrasonic transducers 29 transmit concentrated vibratory energy into a localized portion of the stream 23 producing cavitations therein. The height 46 of the agitated stream 23 is controlled to disperse any surface contaminants in the solder and to scrub the component lead surfaces thereby insuring clean surfaces with a high degree of solderability. As mentioned previously, this stream portion 20 also serves as a pretinning station and tends to repair defective land portions of the board circuits.

Figure 2:
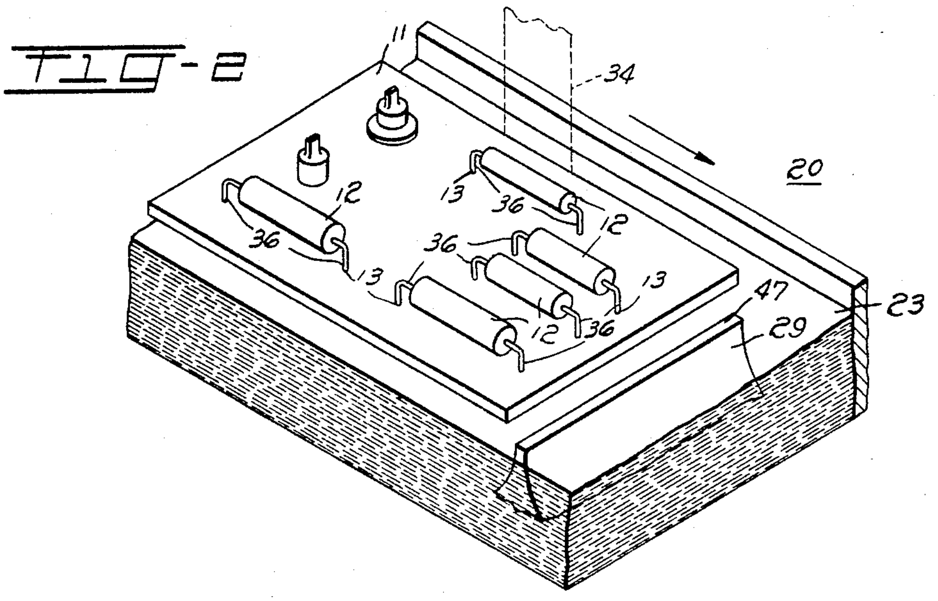
FIG. 2 is a partial isometric view illustrating the arrangement of an ultrasonic tool with respect to a printed wiring board in a mass soldering apparatus.

FIGURE 2 illustrates a printed wiring board 11 passing through the cleaning and pretinning work station 20 with the transversely situated ultrasonic tool 29 in an unoperated state. It can be noted that the tool surface 47 is relatively narrow so as to agitate a localized area of the stream 23 with a maximum concentration of energy and minimum power loss. The dimension of the transverse stream portion agitated by the tool 29 is, therefore, rather confined in the direction of feed of the wiring boards 11 when compared to the dimension of the boards 11 in said direction.

The wiring board 11 proceeds upstream in the indicated direction with the base 16 held above the stream for a predetermined distance. At the upper soldering station 30, the circuit connections are soldered by contact with the solder stream 23 which is directed against the base 16 by the washboard-like projections 37. Further along, the boards 11 which have been soldered in their progress through the stream 13 are removed from the conveyor 38 inspected and stored.

The ultrasonic transducer unit 29 may be a step-type or similar tool connected to a magnetostrictive stack 41 with suitable driving means, such as an electrical oscillating unit 42. If desired, a diaphragm can be coupled to the transducer to transmit the vibratory energy into the liquid solder medium. The diaphragm is normally tuned to the frequency of the ultrasonic energy and vibrates in phase and with equal amplitude. Where a plurality of diaphragms 32 are used, as shown in FIG. 3, a high degree of control may be attained by synchronizing the vibrators 29 with respect to one another to regulate the stream agitation.

The ultrasonic soldering method disclosed herein makes possible an end product quality of about 99.998%. Present quality rates for a commercial process would be approximately 95–99%, reflecting to a large extent variations in lead wire finishes. Either a great many manual touch-up operations are presently required on rejects or excessive failures will occur in the field. Consequently, ultrasonic energy is ideally adapted to the mass soldering process particularly at temperatures utilized for printed boards.

While the foregoing comprise preferred embodiments of this invention, it may also be possible utilizing the principles disclosed herein to move a succession of printed boards 11 through a stationary bath wherein ultrasonic vibrators 29 would be used to prepare leads for a subsequent soldering operation.

It is to be understood that the above described arrangements are simply illustrative of the principles of the invention. Numerous other arrangements may be readily deviced by those skilled in the art which will embody the principles of the invention and fall within the spirit and scope thereof.

What is claimed is:

1. A method of mass soldering printed wiring boards having components mounted thereon with leads contacting the printed circuit comprising the steps of:
  moving a succession of wiring boards into a flowing solder stream with the printed circuit contacted by the leads on the lower surface of the board,
  cleaning and pretinning component leads at a first work station downstream by providing concentrated vibrations directed towards the leads at a localized portion of the stream from below the surface at a frequency from slightly below 60 cycles to 200,000 cycles,
  removing the boards from the stream for a predetermined distance, and
  re-immersing the boards into the same stream at a subsequent work station located upstream for soldering the tinned leads to the printed circuit.

2. A method according to claim 1 wherein:
  the vibrated stream portion is cavitated by a plurality of ultrasonically driven diaphragms located in a staggered array transverse to the movement of the board through the stream.

3. A method according to claim 1 wherein:
  the vibrated stream portion is actuated by a resilient diaphragm coupled to a plurality of ultrasonic tools.

4. A method of mass soldering printed wiring boards having components mounted thereon with leads contacting the printed circuit comprising the steps of:
  moving a succession of printed wiring board circuits along a continuously flowing solder stream maintained slightly above the melting point of the solder,
  immersing the boards to a predetermined depth, with the circuits facing the stream, at a first work station downstream,
  vibrating a localized transverse portion of the stream at said work station from below the surface of the stream to produce cavitations for pretinning component leads and repairing defective land areas on the printed circuits, the dimension of the transverse portion being relatively small in the direction of feed of the wiring boards compared to the dimension of the boards in said direction, the frequency range of the vibration being from approximately 60 cycles to several hundred thousand cycles,
  moving the boards out of the stream for a set distance,
  contacting the pretinned leads and wiring board circuit with the said stream at a sceond work station upstream to solder the leads to the circuit, and
  continuously feeding solder in a closed path from the upstream end to the downstream end and back to the upstream end.

5. An apparatus for mass soldering printed wiring boards having components mounted thereon with leads contacting the printed circuit comprising:
  a continuously circulating solder system, including a main reservoir, a pumping reservoir and a subsidiary reservoir, an external inclined stream trough for pretinning and soldering having an upstream section and a downstream section, said downstream section flowing into the subsidiary reservoir, an inclined overflow from the subsidiary reservoir to the main reservoir, pumping means raising the solder from beneath the surface of the main reservoir to the pumping reservoir and then onto the upstream section of the inclined stream trough and heating means to keep the circulating solder in a molten condition throughout the system,
  a conveyor for carrying printed wiring boards in a plane parallel to the inclined stream trough of the solder system so that the circuits are brought into contact with the stream,
  a first work station located in the introductory downstream section of the stream trough having means for producing concentrated vibrations in a localized portion of the stream from beneath the surface at a frequency from slightly below 60 cycles to 200,000 cycles in order to clean and pretin component leads at the land areas, said means comprising one or more tapered vibrators situated transverse to the conveyorized movement of boards through the stream,
  a depressed intermediate stream trough section where the conveyor-carried board is out of contact with the stream, and
  a second work station upstream having means directing the flowing solder stream against the leads to solder them to the wiring board circuit and to refinish the wiring board circuits.

References Cited by the Examiner

UNITED STATES PATENTS 3,084,650 4/1963 Johns ------------ 29—503 X

JOHN F. CAMPBELL, *Primary Examiner.*